United States Patent
Yamaguchi et al.

(10) Patent No.: US 6,779,534 B2
(45) Date of Patent: Aug. 24, 2004

(54) APPARATUS AND METHOD FOR DRYING WASHED OBJECTS

(75) Inventors: Kensuke Yamaguchi, Tokyo (JP); Yoshinori Ishikawa, Tokyo (JP); Ki Han, Tokyo (JP)

(73) Assignee: Kaijo Corporation, Tokyo (JP)

(*) Notice: Subject to any disclaimer, the term of this patent is extended or adjusted under 35 U.S.C. 154(b) by 0 days.

(21) Appl. No.: 10/235,069

(22) Filed: Sep. 4, 2002

(65) Prior Publication Data

US 2003/0168086 A1 Sep. 11, 2003

(30) Foreign Application Priority Data

Mar. 5, 2002 (JP) ........................................ 2002-058652

(51) Int. Cl.⁷ .............................. B08B 5/00; F26B 21/00
(52) U.S. Cl. .................. 134/102.2; 134/95.2; 134/95.3; 134/198; 134/902; 34/566
(58) Field of Search .............................. 134/95.2, 95.3, 134/100.1, 102.2, 133, 135, 154, 200, 198, 902; 634/565, 566, 585, 588

(56) References Cited

U.S. PATENT DOCUMENTS

| | | |
|---|---|---|
| 4,911,761 A | 3/1990 | McConnell et al. |
| 6,158,449 A * | 12/2000 | Kamikawa .................... 134/61 |
| 6,192,600 B1 * | 2/2001 | Bergman ...................... 34/267 |
| 6,415,803 B1 * | 7/2002 | Sundin et al. .............. 134/113 |

FOREIGN PATENT DOCUMENTS

| JP | 06-103686 b2 | 12/1994 |
|---|---|---|
| JP | 11-307506 A | 11/1999 |
| JP | 3009699 B | 12/1999 |
| JP | 3171807 B | 3/2001 |

* cited by examiner

*Primary Examiner*—Frankie L. Stinson
*Assistant Examiner*—Joseph L. Perrin
(74) *Attorney, Agent, or Firm*—Frishauf, Holtz, Goodman & Chick, P.C.

(57) ABSTRACT

An apparatus and a method for drying washed objects being capable of drying the objects in a reduced period of time, effectively preventing contamination of the objects, and preventing energy loss are provided. The apparatus for drying washed objects includes a drying tank having an opening on the upper portion thereof so that the washed objects can be placed or taken out from above, and a rinsing tank formed integrally with the drying tank, and is capable of being sealed hermetically by closing the openable and closable lid. The drying tank includes a mist-straightening vane for supplying organic solvent mist at normal temperatures to the washed objects, so that the washed objects are dried by organic solvent mist emitted from the mist-straightening vane.

11 Claims, 17 Drawing Sheets

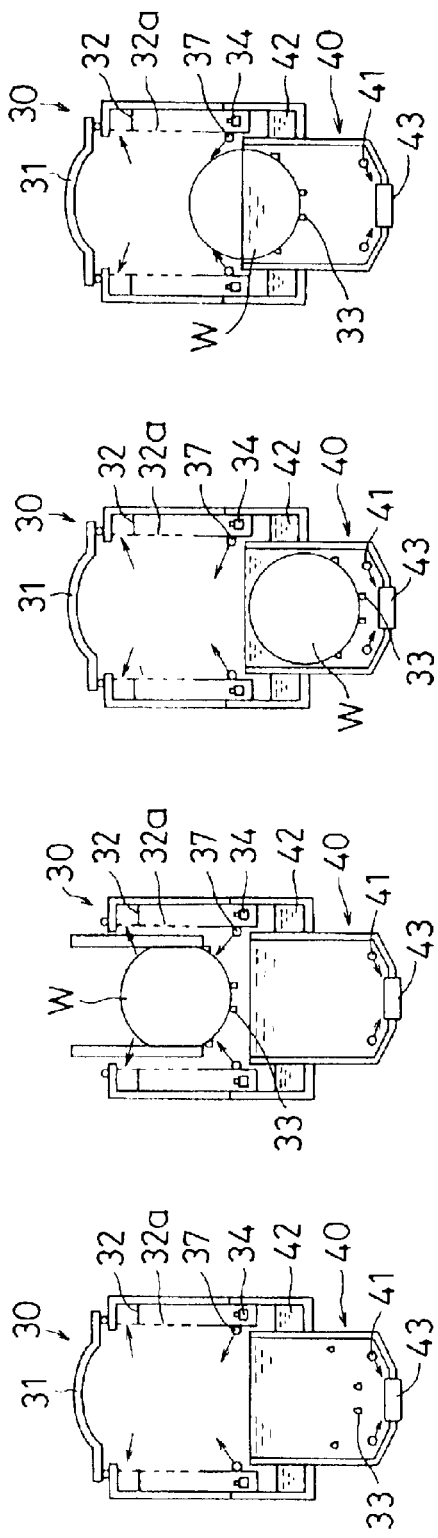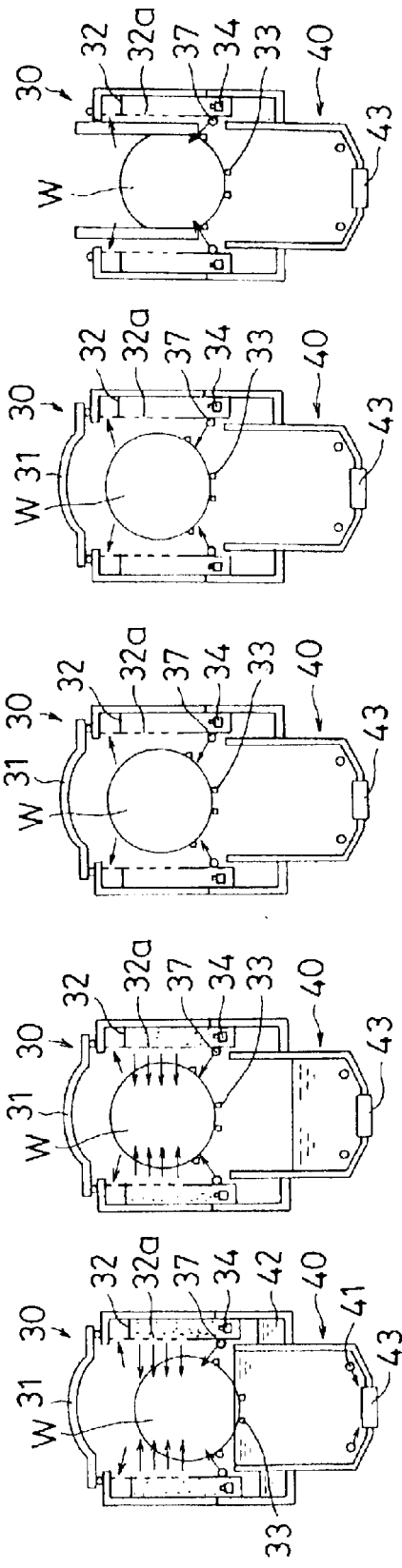

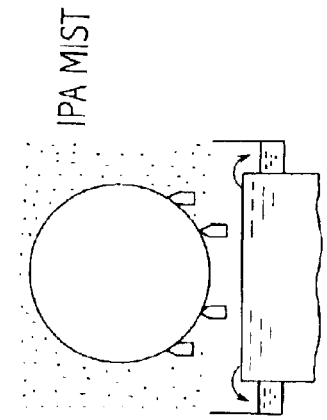
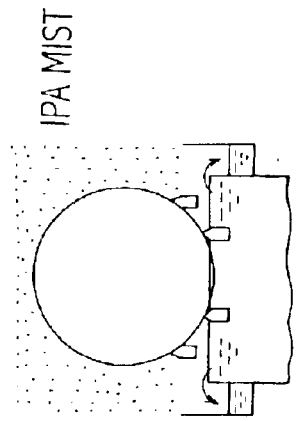
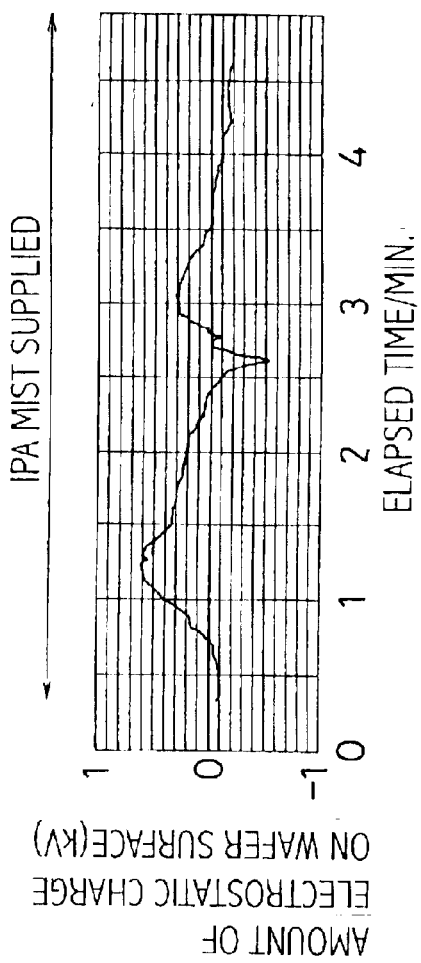
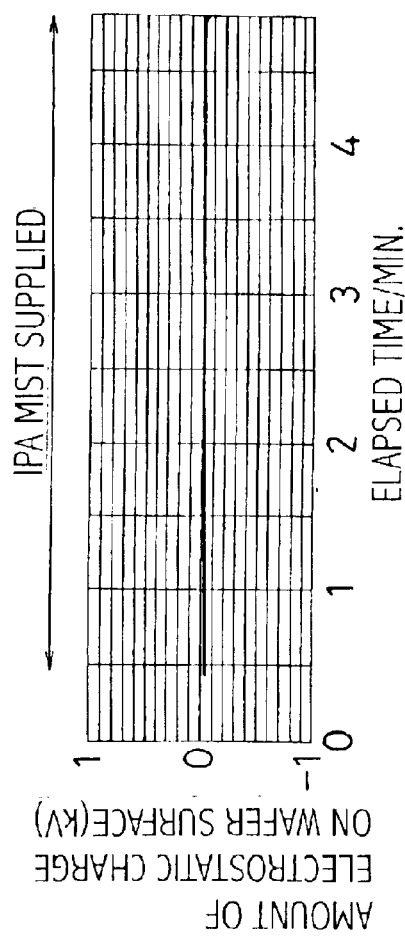
FIG.12(a)
FIG.12(b)

APPARATUS AND METHOD FOR DRYING WASHED OBJECTS

BACKGROUND OF THE INVENTION

1. Field of the Invention

The present invention relates to an apparatus and a method for drying washed objects, and more specifically, to an apparatus and a method for drying washed objects being suitable for washing, rinsing, and drying substrates of semiconductor wafers.

2. Description of the Related Art

Heretofore, removal of moisture entered in trenches is an important factor in drying of miniaturized washed objects such as wafers after washing of precision substrates, and thus a drying apparatus using organic solvent vapor is employed. An apparatus shown in FIG. 1 is known as a drying apparatus using organic solvent vapor.

The drying apparatus 1 includes, as shown in FIG. 1, a drying tank 2 being box-shape having an opening on top thereof in cross section, a heating device (heater) 3 mounted on the bottom surface 2a of the drying tank 2, a cooling coil 4 provided on the upper part of the drying tank 2, a solvent trap 5 provided downwardly of the cooling coil 4, a wafer placing table 7 disposed in the drying tank 2 for placing a wafer 6 as a washed object thereon, and a solvent pooling section 8 disposed downwardly of the wafer placing table 7.

The drying apparatus 1 heats organic solvent 9 charged into the drying tank 2 to a boiling point by the heater 3 and generates organic solvent vapor in the upper portion thereof. A wafer 6 already washed and rinsed with water is then inserted and arranged in the vapor in the drying tank 2. Condensation of organic solvent occurs on the surface of the wafer 6 that is inserted and arranged in the drying tank 2, and then moisture attached on the surface of the wafer 6 is replaced by organic solvent which is more likely to evaporate, whereby the wafer 6 is progressively dried. The wafer 6 in the organic solvent vapor is gradually increased in temperature to an evaporating point (boiling point), and then is taken out of the mist atmosphere, where attached solvent component rapidly evaporates due to its low latent heat, to be completely dried.

The organic solvent heated and vaporized by the cooling coil 4 disposed on the upper part of the drying tank 2 is condensed and dropped in the solvent trap 5 for recovery and reusing. Likewise, solvent including moisture dropped from the wafer 6 is also recovered in the solvent pooling section 8.

The drying apparatus 1 in the related art demands attention to flames since organic solvent is heated by the heater 3, and consumes a lot of energy because it carries out heating and cooling. In addition, it requires a significant period of time until a vapor layer is formed by being heated by the heater 3, and consumes a large quantity of organic solvent due to evaporation. Further, when the washed objects come in contact with the mist layer, heat of vapor (gas phase) is absorbed by the washed object, thereby causing abrupt change in phase (gas phase to liquid phase) and reducing the vapor layer. Consequently, the washed object is exposed to the atmosphere, which may easily results in contamination, insufficient drying, and so on.

SUMMARY OF THE INVENTION

Accordingly, it is an object of the present invention to provide an apparatus and a method for drying washed objects being capable of drying the washed objects in a reduced period of time, effectively preventing contamination of the objects, and preventing energy loss.

The apparatus for drying washed objects according to the invention includes a drying tank in which organic solvent mist is generated and supplied to washed objects therein, wherein the drying tank includes a mist-straightening vane for supplying organic solvent mist to the washed objects.

The mist-straightening vane of the apparatus for drying washed objects according to the invention is provided on the side wall of the drying tank, and is provided with a plurality of fine openings on the surface for emitting organic solvent mist at the position upwardly of a fluid spray nozzle away from a prescribed distance S, so that a portion of organic solvent mist that passed through the opening out of the whole part of organic solvent mist emitted from the fluid spray nozzle is indirectly emitted.

The fluid spray nozzle of the apparatus for drying washed objects according to the present invention can emit two or more different types of fluid simultaneously.

Fluid emitted from the fluid spray nozzle of the apparatus for drying washed objects according to the invention includes organic solvent mist and inert gas.

The configuration of the opening of the apparatus for drying washed objects according to the invention is chamfered configuration.

The apparatus for drying washed objects according to the invention includes a drying tank having an opening on top thereof so that the washed objects can be placed or taken out from above and a rinsing tank formed integrally with the drying tank, and is capable of being sealed hermetically by closing the openable and closable lid, and the drying tank includes a mist-straightening vane for supplying organic solvent mist to the washed objects.

The drying tank of the apparatus for drying washed objects according to the invention includes an overflow tank formed on top of the rinsing tank integrally for overflowing deionized water to be supplied into the rinsing tank, and a channel for drainage from the overflowing tank is grounded.

The apparatus for drying washed objects according to the invention includes cradles for placing and holding washed objects in the drying tank and in the rinsing tank, and the cradle can be moved upward and downward by a hoisting mechanism and can be stopped in a state in which a part of the washed object is in contact with the fluid level directly or indirectly.

The portion of the washed object that is immersed into the fluid level of the rinsing tank of the apparatus for drying washed objects according to the invention is the portion other than the patterned surface.

A method for drying washed objects according to the invention is a method for drying washed objects for performing drying by the use of a drying apparatus including a drying tank having an opening on top thereof so that washed objects can be placed or taken out from above, and a rinsing tank formed integrally with the drying tank, and is capable of being sealed hermetically by closing an openable and closable lid, comprising the steps of moving a cradle for placing and holding washed objects upward and downward by a hoisting mechanism after the washed object was rinsed in the rinsing tank and stopping the same in a state in which a part of the washed object is in contact with the fluid surface directly or indirectly, performing drying process by emitting organic solvent mist to the washed object from a fluid spray nozzle provided on a mist-straightening vane and emitting the same in turn from the mist-straightening vane indirectly, draining deionized water after the drying step, and performing quick drying process by supplying inert gas at a high temperature into the drying tank after the draining step.

In a method for drying washed objects according to the invention, the washed object is wet when the washed object is drawn up from the rinsing tank by the hoisting mechanism.

In a method for drying washed objects according to the invention, the inert gas is nitrogen gas ($N_2$) at normal temperatures or heated nitrogen gas ($N_2$).

In a method for drying washed objects according to the invention, an organic solvent for generating the mist of organic solvent is selected from alcohols, ketones, or ethers having water solubility and capability of lowering surface tension of deionized water with respect to the substrate.

In a method for drying washed objects according to the invention, the diameter of organic solvent mist emitted indirectly from the mist-straightening vane is not more than 20 μm.

In a method for drying washed objects according to the invention, the organic solvent can be heated to temperatures within the range of 5° C. to 80° C. when it is IPA (Isopropyl alcohol).

In a method for drying washed objects according to the invention, rinsing water for performing rinsing operation in the rinsing tank is hydrogenated water.

BRIEF DESCRIPTION OF THE DRAWINGS

FIGS. 9(a) to 9(i) are explanatory drawings showing the drying process in a drying method according to the invention;

FIGS. 12(a) and 12(b) are explanatory drawings illustrating the amount of electrostatic charge on the surface of wafer shown in FIG. 11;

DESCRIPTION OF THE PREFERRED EMBODIMENTS

Figure 1:
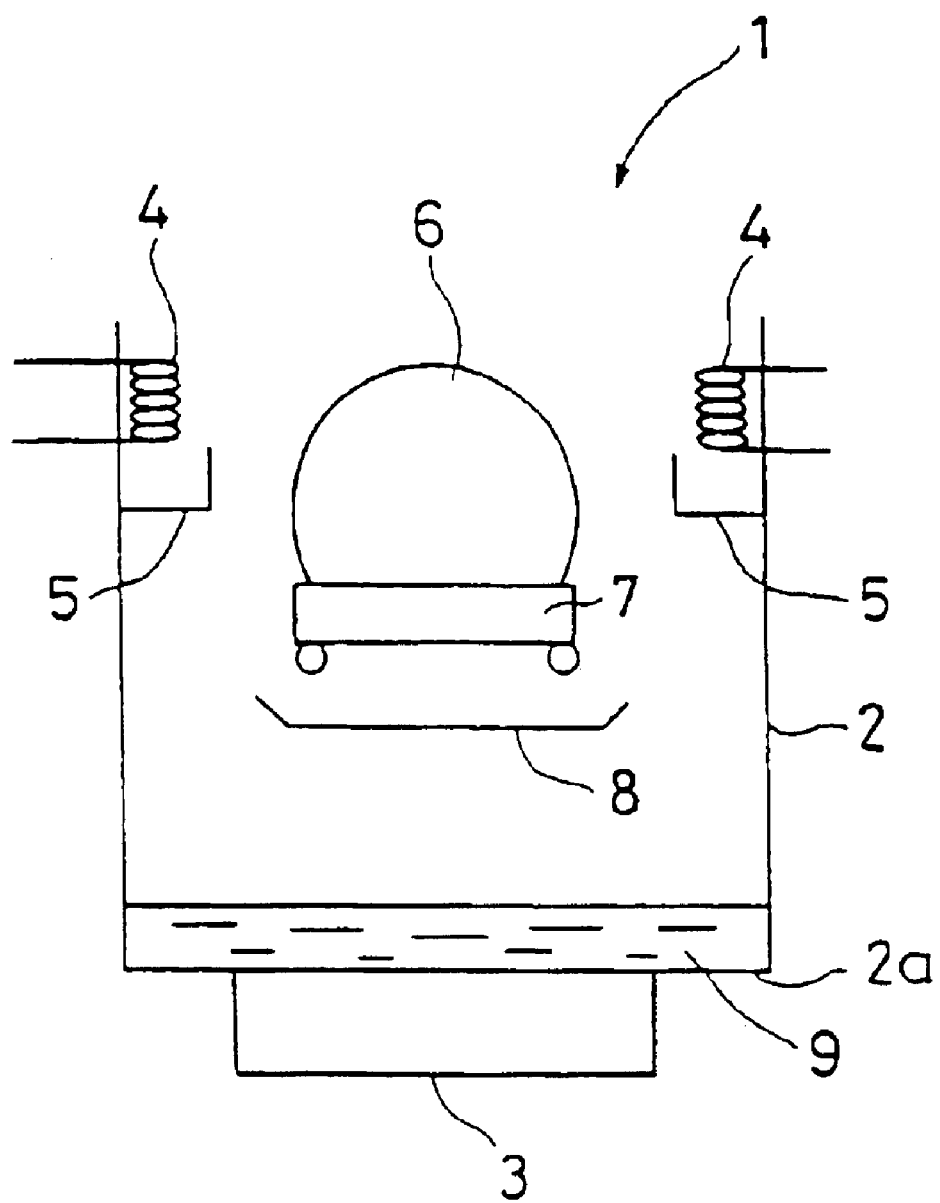
FIG. 1 is a drawing showing a drying apparatus in the related art.
Figure 2:
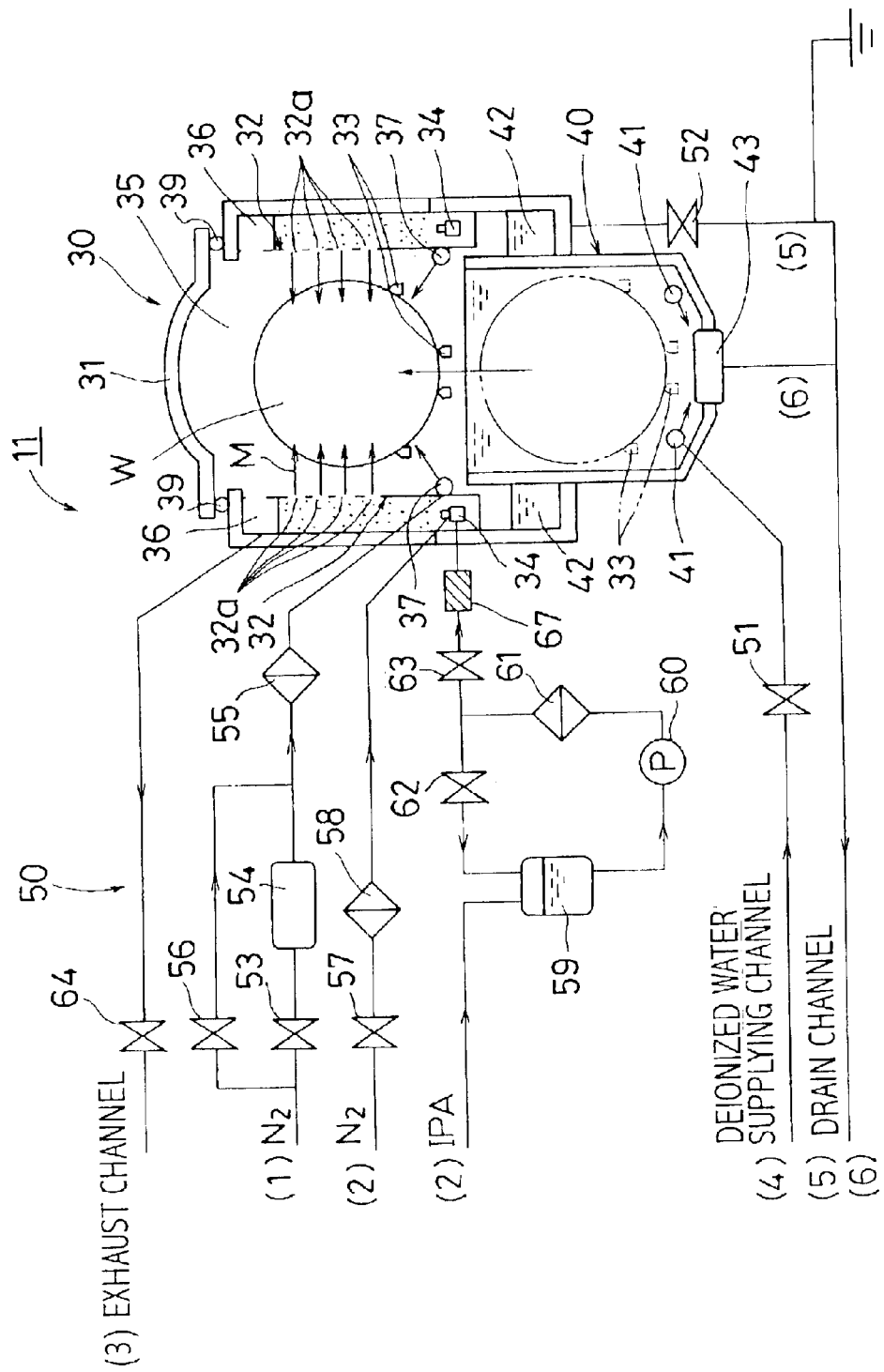
FIG. 2 shows a drying apparatus according to an embodiment of the invention partially in cross section.

Referring now to the drawings, an embodiment of a drying apparatus and a drying method according to the invention will be described. FIG. 2 is a drawing showing a drying apparatus according to an embodiment of the invention partly in cross section.

As shown in FIG. 2, the drying apparatus 11 includes a drying tank 30, a rinsing tank 40, and a plumbing system 50. The drying tank 30 is provided on top of the rinsing tank 40 integrally therewith. The drying tank 30 is open on top thereof and thus the wafer W as washed objects can be placed or taken out from above, and is capable of being sealed hermetically by closing an openable and closable lid 31. In other words, a lid packing 39 completely prevents outside air from entering therein. The openable and closable lid 31 is opened and closed by sliding movement thereof via a guiding mechanism, which is not shown in the figure, in the vertical direction with respect to the plane of FIG. 2. FIG. 2 shows the closed state.

The drying tank 30 and the rinsing tank 40 are constructed of members having non-conductive properties and corrosion resistance properties, and are box-shape opening on top in cross section. The rinsing tank 40 is slightly smaller than the drying tank 30, and the upper portion of the rinsing tank 40 is placed into the lower portion of the drying tank 30. It is for allowing deionized water in the rinsing tank 40 to overflow.

As shown in FIG. 2, mist-straightening vanes 32 for supplying organic solvent mist, which is IPA in this embodiment, indirectly to the wafer W as a washed object are provided on both sides of the side wall of the drying tank 30 so as to sandwich the outer peripheral surface of the wafer W. The wafer W in the drying tank 30 is, as shown in FIG. 2, substantially circular (a part of the outer periphery is cut out to form an orientation flat), and a plurality of wafers W are disposed in parallel at regular intervals in the vertical direction with respect to the plane of the figure. Generally, when they are semiconductor wafers, for example, 100 pieces of wafers measuring 8 inches in diameter may be placed, though the number and the diameter may be selected as appropriate. These wafers W are placed on the cradle 33 having four supporting members in this embodiment. In this embodiment, the wafer W is assumed to have 12 inches in diameter. As shown in FIG. 2, the cradle 33 is capable of moving upward and downward between the rinsing tank 40 and the drying tank 30 by the aid of a hoisting mechanism, which is not shown.

Figure 3:
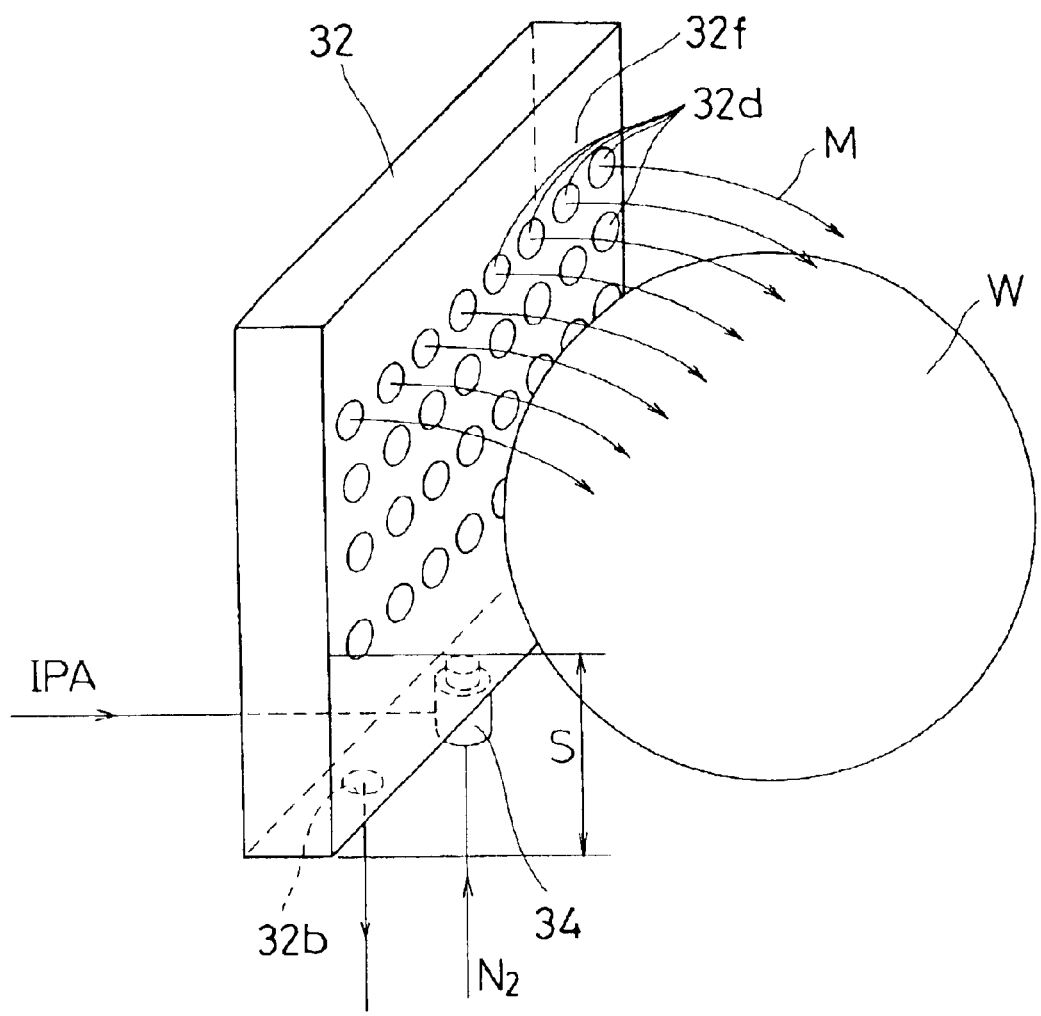
FIG. 3 is an explanatory drawing illustrating a state in which organic solvent mist is emitted indirectly by the use of a mist-straightening vane.
Figure 4:
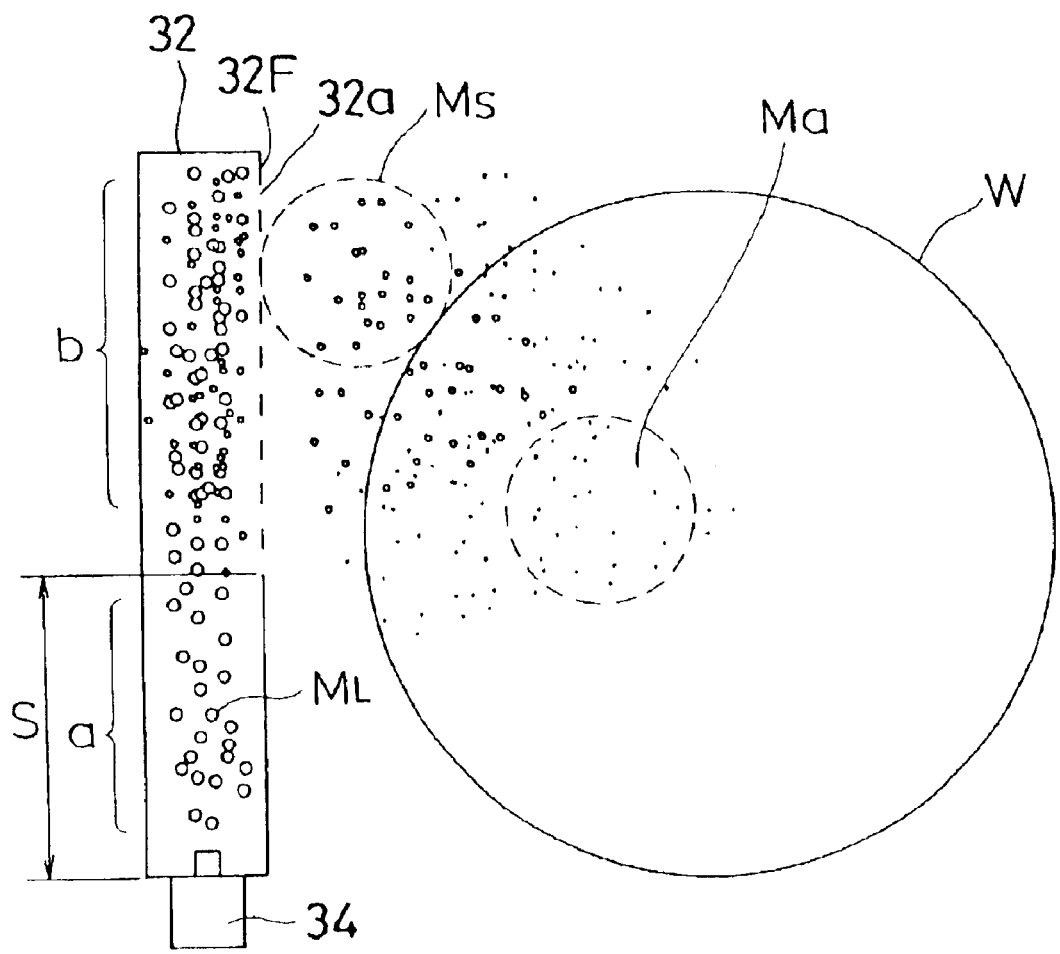
FIG. 4 is an explanatory drawing illustrating the diameter of organic solvent mist emitted from the mist-straightening vane and the emitting state.

The mist-straightening vane 32 is formed entirely of a laterally elongated rectangular solid as shown in FIG. 3, and has a width that enable itself to supply organic solvent mist M, which is IPA in this case, to the main surfaces of the plurality of wafers W simultaneously. Formed on the surface 32F of the mist-straightening vane 32 positioned on the side of the peripheral surface of the wafer W are a plurality of fine openings 32a. The size of the opening 32a is approximately 5 mm in this embodiment. The openings 32a are, as shown in FIG. 4 as well, not formed on the area from the lower end of the mist-straightening vane 32 (the position on which a fluid spray nozzle 34 is to be mounted) to the point at a distance S. The organic solvent mist M of IPA is, as shown in FIG. 2 through FIG. 4, supplied by a sufficient amount in the form of high-density mist M of an organic solvent (two different types of fluid are supplied in this embodiment) from the fluid spray nozzle 34 mounted at the lower portion of the mist-straightening vane 32, filled inside the mist-straightening vane 32, and supplied from the openings 32a indirectly to the wafer W. The diameter of the emission aperture of the fluid spray nozzle 34 is approximately 1 mm. The organic solvent for generating the organic solvent mist is selected from alcohols, ketones, or ethers having water solubility and capability of lowering surface tension of the deionized water with respect to the substrate.

Referring now to FIG. 4, the change in the state of the organic solvent mist M in this embodiment will be described in detail. The organic solvent mist M emitted from an emission aperture at the tip of the fluid spray nozzle 34 and in the region a, that ranges from the lower end to the position at a distance S (about 100 mm in this embodiment), is filled with organic solvent mist ML of at least 20 $\mu$m. On the other hand, the region b upwardly of the region a is filled with mixture of organic solvent mist ML of at least 20 $\mu$m and organic solvent mist MS of less than 20 $\mu$m. The mixed organic solvent mist ML and MS are straightened at the openings 32a on the mist-straightening vane 32, and only the organic solvent mist MS passes therethrough and is supplied to the wafer W. The organic solvent mist ML of at least 20 $\mu$m is condensed inside the mist-straightening vane 32 and discharged from a discharge port 32b shown in FIG. 3.

Figure 13:
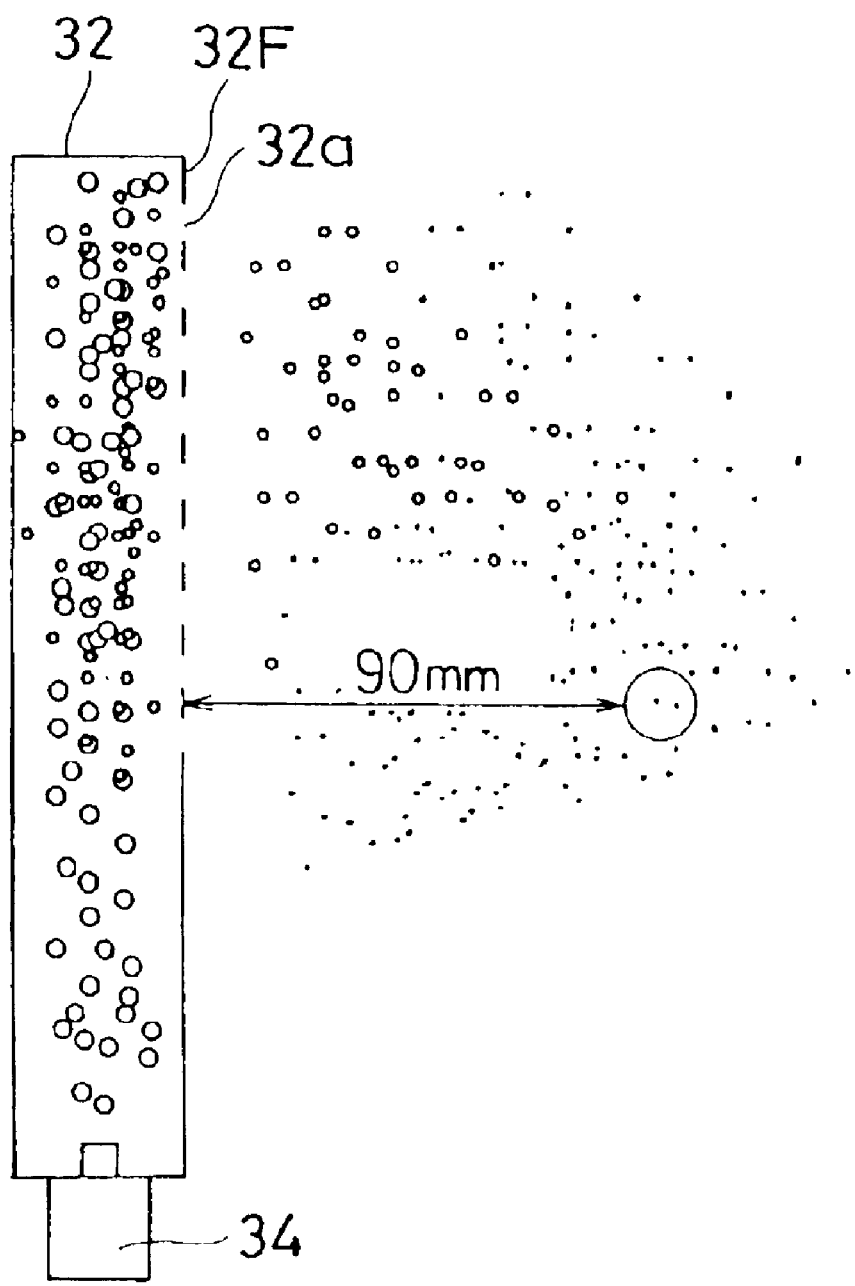
FIG. 13 is a drawing showing a state in which the diameter and the number of the particles of organic solvent mist M are measured by the use of a Phase Doppler Particle Analyzer for five minutes when the mist-straightening vane is used.
Figure 14A:
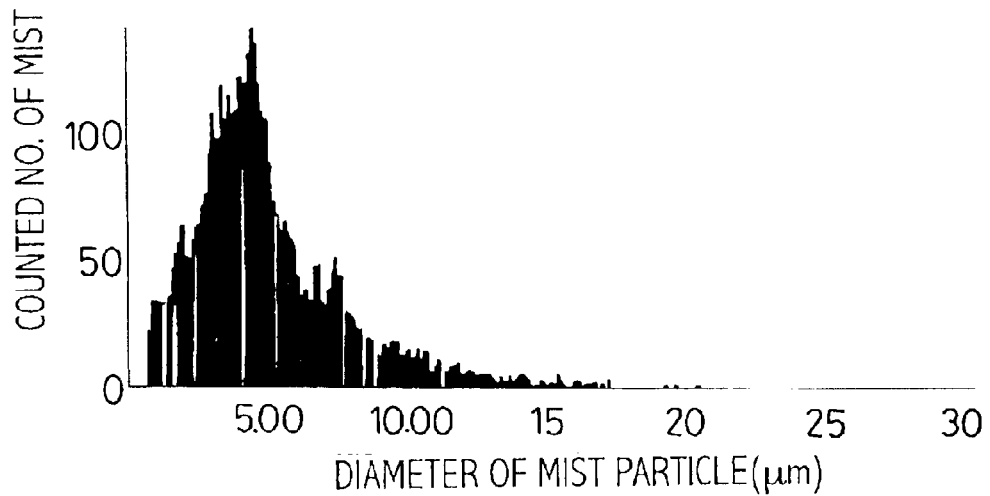
FIG. 14(a) is a drawing showing results of measurement in the experiment conducted in conjunction with FIG. 13.
Figure 14B:
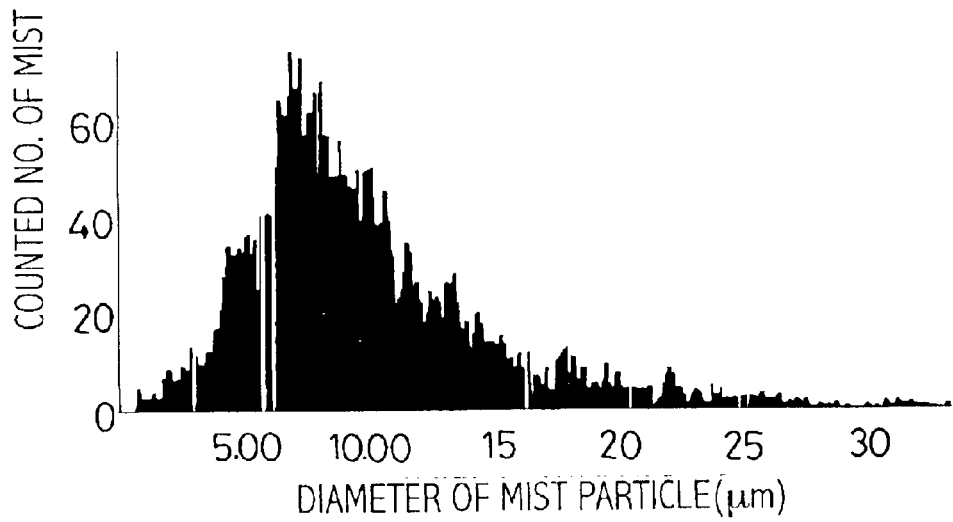
FIG. 14(b) is a drawing showing results of measurement of the diameter and the number of particles of organic solvent mist M without using the mist-straightening vane shown in FIG. 13.

FIG. 13 is a drawing showing a state in which the diameter and the number of particles of organic solvent mist M when using the mist-straightening vane 32 are measured by the use of a Phase Doppler Particle Analyzer for five minutes, FIG. 14(a) is a drawing showing results of experiment conducted in conjunction with FIG. 13, and FIG. 14(b) is a drawing showing results of measurement of the diameter and the number of particles of the organic solvent mist M without using the mist-straightening vane shown in FIG. 13. The lateral axes in FIG. 14(a) and FIG. 14(b) represent the diameter of the particle of the mist ($\mu$m) and the vertical axes thereof represent the number of mist particles.

As shown in FIG. 13 and FIG. 14, when the mist-straightening vane 32 was not used, the mist diameter showing the peak of the number of mist particles was in the vicinity of 8 $\mu$m, and the average mist particle diameter was 11.5 $\mu$m. Many large particles measuring at least 10 $\mu$m in diameter were also detected.

On the other hand, when the mist-straightening vane 32 was used, the mist diameter showing the peak of the number of mist particles was in the vicinity of 5 $\mu$m, and the average mist particle diameter was 6.4 $\mu$m. Large particles measuring at least 10 $\mu$m in diameter were found little or nothing.

As is described thus far, the invention is contemplated based on the fact that it is important to supply organic solvent mist M uniformly to the space between the wafers W in order to dry a plurality of wafers W simultaneously, and thus organic solvent mist M having smaller diameter is more preferable. It is because the particles of organic solvent mist M having smaller diameter can be gasified easily in comparison with the particles having larger diameter, and thus the rate of diffusion in the air increases. Organic solvent mist Ma shown in FIG. 4 is in the state of being gasified.

Therefore, according to the invention, organic solvent mist M of IPA is indirectly emitted by the use of the mist-straightening vane 32 without heating for generating organic solvent mist M as in the related art, whereby high-securities are ensured and organic solvent mist M can be supplied immediately, thereby improving operating efficiency of the entire apparatus.

Figure 5A:
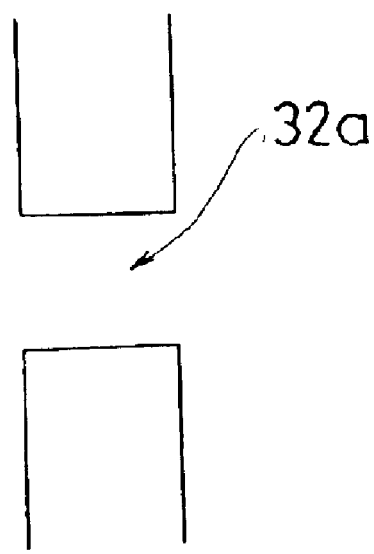
FIG. 5(a) and FIG. 5(b) are enlarged cross sectional views showing the configurations of the opening on the mist-straightening vane.
Figure 5B:
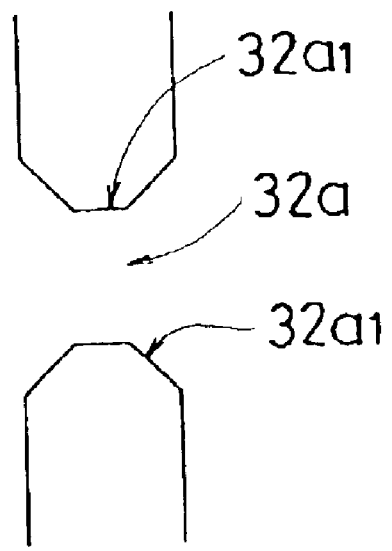

FIG. 5(a) and FIG. 5(b) are enlarged cross sectional view showing the configuration of the opening 32a on the mist-straightening vane 32.

The semiconductor wafer W and organic solvent mist M of IPA have a property that is apt to be charged. Therefore, in the case where the edge portion of the opening 32a is acutely angled as shown in FIG. 5(a), electrostatic charge causes concentration of electric field, and thus increases probability of discharge, which results in charging of the wafer W by induction. Therefore, in order to prevent such a condition, the edged portion in this embodiment is not formed into an acutely angled edge as shown in FIG. 5(b), but chamfered to prevent electric field from concentration when being charged, and to reduce the probability of occurrence the discharging phenomenon. In this embodiment, other chamfered configuration may be employed as far as it can reduce the probability of occurrence of the discharging phenomenon. The organic solvent mist is also referred to as IPA mist.

As shown in FIG. 2, the drying tank 30 is provided with a exhaust port 36 at the upper portion thereof and a nitrogen gas supply port 37 for supplying nitrogen gas ($N_2$).

The rinsing tank 40 is supplied with deionized water through the deionized water supplying nozzle 41 for supplying deionized water as shown in FIG. 2. When deionized water supplied into the rinsing tank 40 reaches to a certain level, it is stored temporarily in an overflow tank 42 shown in FIG. 2 and then is overflowed through the channel with a drain valve 52. The channel with the drain valve 52 is grounded. In such a situation, a gaseous phase portion 35 is formed in the drying tank 30. The rinsing tank 40 is provided with a drain valve 43 for draining deionized water at the center on the bottom thereof, so that deionized water in the tank is drained through the drainage duct when the drain valve 43 is opened.

The plumbing system 50 to be connected to the drying tank 30 and rinsing tank 40 will be described below.

The plumbing system 50 includes (1) a channel for supplying nitrogen gas ($N_2$) to the nitrogen gas supply port 37, (2) a channel for supplying two types of fluids, IPA as an organic solvent and nitrogen gas ($N_2$), to the fluid spray nozzle 34, (3) a channel for exhausting air from the drying tank 30, (4) a channel for supplying deionized water into the rinsing tank 40, (5) a channel for drainage from the overflow tank 42, and (6) a channel for draining deionized water in the rinsing tank 40. Control of the plumbing system 50 is performed by a control unit which is not shown in the figure.

(1) In the channel for supplying nitrogen gas ($N_2$) to the nitrogen gas supply port 37, nitrogen gas ($N_2$) at ordinary temperatures supplied when the valve 53 is in the opened state (ON) is heated by a heater 54 and supplied to the nitrogen gas supply port 37 through a filter 55. Nitrogen gas ($N_2$) at high temperatures heated by the heater 54 is used for quickly drying the wafer W as a washed object in the drying tank 30. In the cannel for supplying nitrogen gas ($N_2$) to the nitrogen gas supply port 37, as shown in FIG. 2, when the aforementioned valve 53 is in the opened state (ON), the other valve 56 is in the closed state (OFF). In contrast to it, when the valve 53 is in the closed state (OFF), the valve 56 is in the opened state (ON), and nitrogen gas ($N_2$) at ordinary temperatures is supplied to the drying tank 30 through the filter 55. Even when the wafer W as a washed object does not exist in the drying tank 30, clean nitrogen gas ($N_2$) at ordinary temperatures is supplied into the drying tank 30 so that the gaseous phase portion 35 is completely filled.

The valve 53, the valve 56, and the heater 54 can be controlled by the control unit which is not shown, so that switching of the valve 53 and the valve 56, and the temperature of the heater 54 are controlled.

(2) The channel for supplying two different types of fluid, IPA as an organic solvent and nitrogen gas ($N_2$), to the fluid spray nozzle 37 includes an IPA tank 59 for storing IPA, a pump 60 for supplying IPA from the IPA tank 59, a filter 61 for cleaning supplied IPA, a valve 62, a valve 63, an IPA heater 67 for heating IPA, and a valve 57 for supplying nitrogen gas ($N_2$), and a filter 58. Two types of fluid, IPA as an organic solvent and nitrogen gas ($N_2$), are supplied to the fluid spray nozzle 34 simultaneously. Nitrogen gas ($N_2$) is for securing safety. Such control is performed by the control unit which is not shown in the figure as described above.

(3) The channel for exhausting air from the drying tank 30 is for sucking and exhausting air from the exhaust port 36 with the valve 64 opened (ON).

(4) The channel for supplying deionized water into the rinsing tank 40 is for supplying deionized water from the deionized water supplying nozzle 41 with the valve 51 opened (ON).

(5) The channel for drainage from the overflow tank 42 is for draining deionized water overflowed from the rinsing tank 40 and IPA which is a dissolved organic solvent through the drain valve 52.

(6) The channel for draining deionized water in the rinsing tank employs a drain valve 43.

Figure 6:
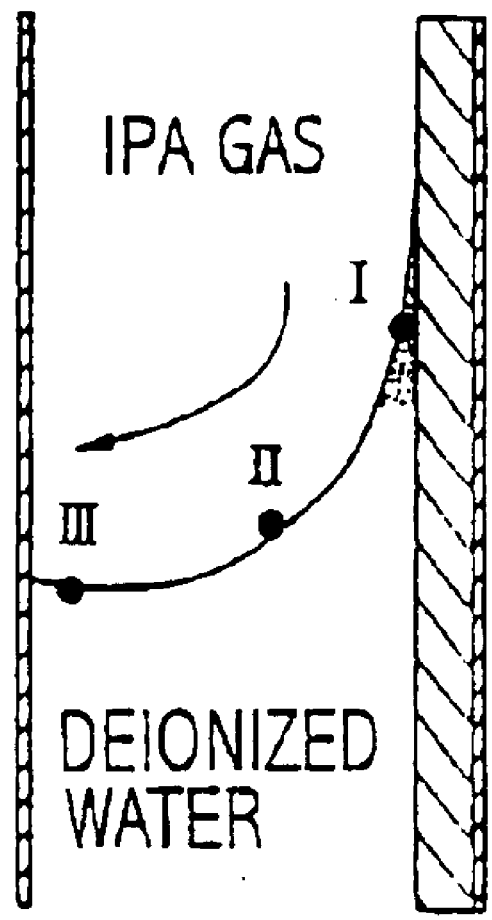
FIG. 6 is a drawing showing a state of transferring particles as a result of being dried using Marangoni Effect, that is, Marangoni Drying, after being etched by DHF (HF/$H_2O$) (diluted hydrofluoric acid)
Figure 7:
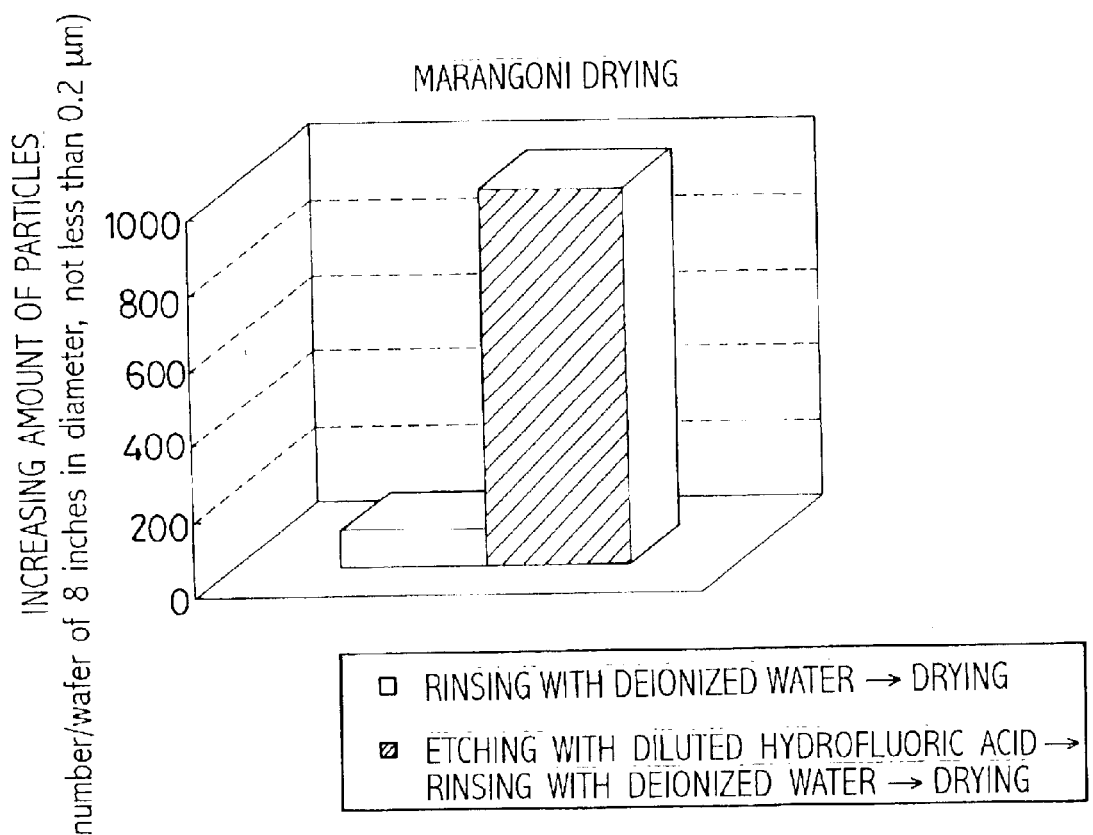
FIG. 7 is a graph of the increasing amount of particles in Marangoni Drying, illustrating the result after performing the steps of rinsing with deionized water→drying, and the result after performing the steps of etching with DHF (HF/$H_2O$) (diluted hydrofluoric acid)→rinsing with deionized water→drying.

The drying method using the drying apparatus of the invention is characterized by being a drying method which does not utilize Marangoni Effects as in the case shown in FIG. 6. FIG. 6 is a drawing showing a state of transferring particles as a result of being dried using Marangoni Effects, that is, Marangoni Drying, after being etched by DHF (HF/$H_2O$) (diluted hydrofluoric acid), and FIG. 7 is a graph of the increasing amount of particles in Marangoni Drying, illustrating the result after performing the steps of rinsing with deionized water→drying, and the result after performing the steps of etching with DHF (HF/$H_2O$) (diluted hydrofluoric acid)→rinsing with deionized water→drying. The concentration of IPA in FIG. 6 is CI>CII, and the surface tension is rI<rII. When the concentration of IPA is CII=CIII, the surface tension is rII=rIII. C represents the concentration of IPA, r represents the surface tension, and Roman numbers I to III represent the position shown in FIG. 6.

As is clear from FIG. 6, IPA gas (not IPA mist) is supplied between a bare wafer and a wafer with an oxidized film, and when deionized water is withdrawn downward in this state, water is apt to be stuck on the bare wafer facing toward the wafer with an oxidized film by Marangoni Force, and the particles are also apt to be stuck on the bare wafer. Therefore, as is clear from FIG. 7, the number of particles increases abruptly when dried by Marangoni Drying after being etched by DHF (HF/$H_2O$) (diluted hydrofluoric acid).

Figure 8:
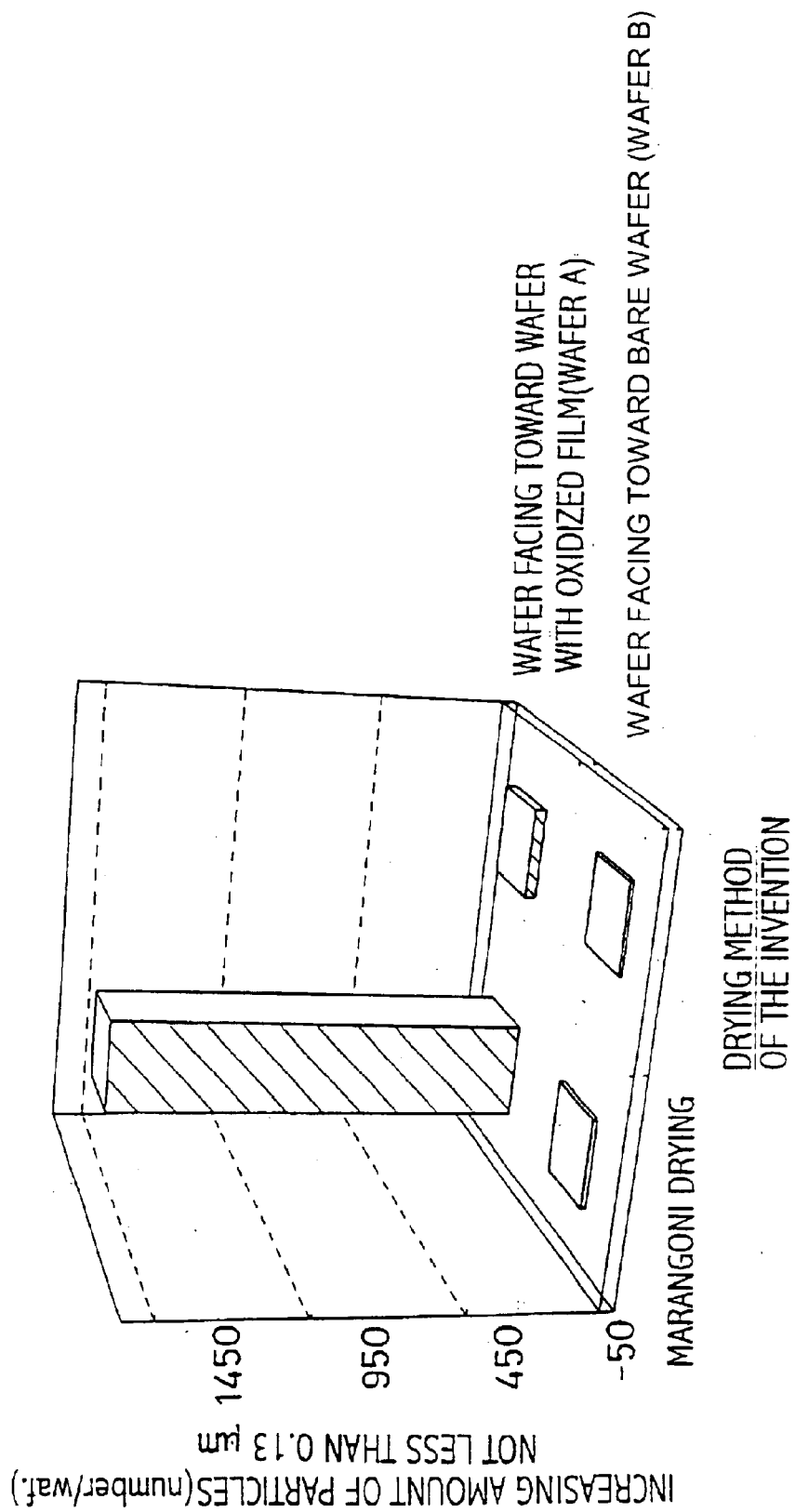
FIG. 8 is a drawing for comparing the amount of increase in particles in Marangoni Drying and drying according to the invention.

FIG. 8 is a graph for comparing the drying method using the drying apparatus according to the invention, and the drying method using Marngoni Effects, and an object of the invention is to provide a drying method in which increase in the number of particles due to Marangoni Drying after being etched by DHF (HF/$H_2O$) (diluted hydrofuoric acid) as shown in FIG. 6 and FIG. 7 is prevented.

Figure 10:
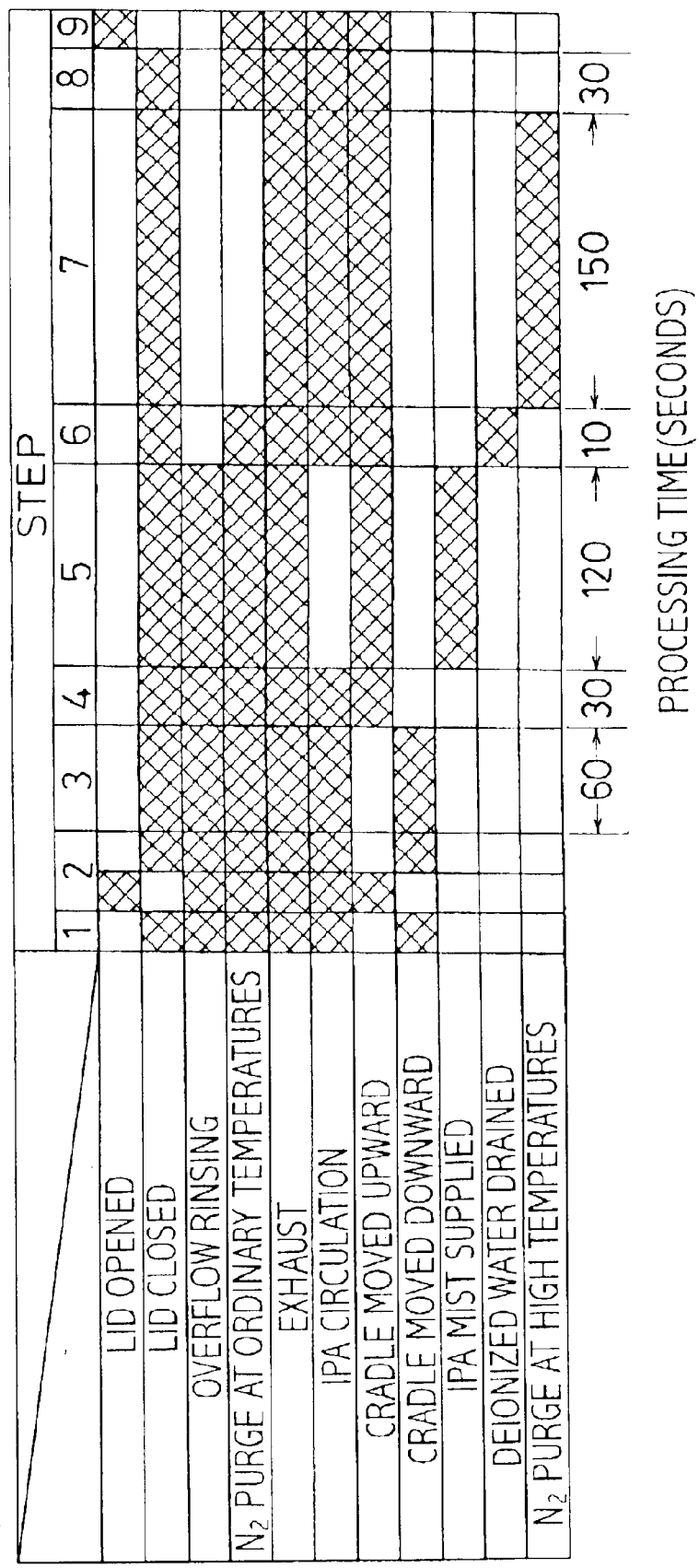
FIG. 10 is a time chart of the drying process according to the invention.
Figure 11:
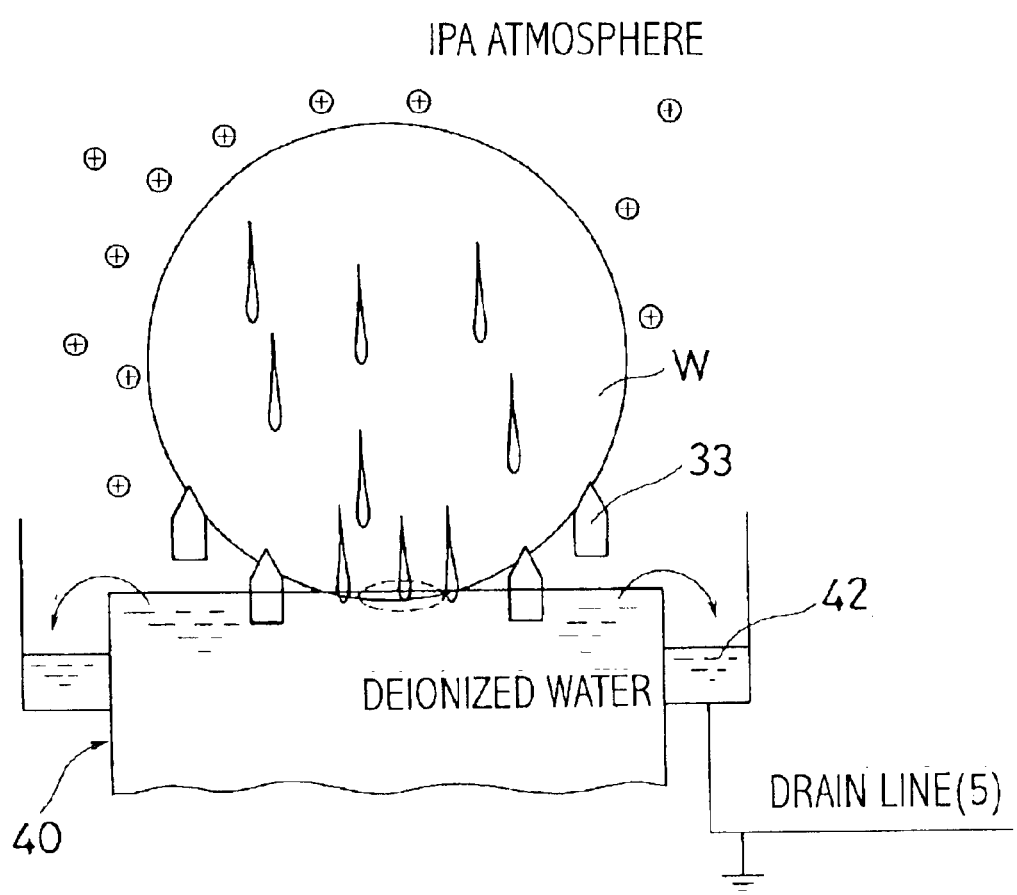
FIG. 11 is an enlarged explanatory drawing of a state shown in FIG. 9(e)

Referring now to FIG. 9 through FIG. 12, the drying method according to the invention will be described. FIG. 9 is an explanatory drawing showing the drying process in the drying method according to the invention, FIG. 10 is a time chart of the drying process according to the invention, FIG. 11 is an enlarged explanatory drawing of a state shown in FIG. 9(e), and FIG. 12 is an explanatory drawing illustrating the amount of electrostatic charge on the surface of the wafer shown in FIG. 11.

(1) Drying Step Shown in FIG. 9(a)

FIG. 9(a) shows a state where no wafer W exists in the drying apparatus 11. As shown in the step 1 in FIG. 10, in a state in which the openable and closable lid 31 is closed, and deionized water is supplied from the deionized water supply channel (4) to the rinsing tank 40 for overflow rinsing, nitrogen gas ($N_2$) is supplied from the nitrogen gas ($N_2$) supply channel (1) through the valve 56, the filter 55, and the nitrogen gas supply port 37 to the drying tank 30, and simultaneously, air is sucked and exhausted from the exhaust channel (3) with the valve 64 opened, and IPA is circulated in the IPA supply channel (2) with the valve 63 closed and the valve 62 opened. At this time, the cradle 33 is lowered into the rinsing tank 40.

(2) Drying Step Shown in FIG. 9(b)

The openable and closable lid 31 of the drying tank 30 is opened and a washed object such as a wafer W that is washed or rinsed is stored, placed and supported on the cradle 33 by means of a carrying unit, not shown. The openable and closable lid 31 is constructed to be openable and closable automatically or manually when the wafer was a washed object is loaded in or unloaded from the drying tank 30 or the rinsing tank 40. As shown in the step 2 in FIG. 10, all the points such as overflow rinsing, supply of nitrogen gas ($N_2$), suction exhaust, and IPA circulation are identical to FIG. 9(a) other than the fact that the openable and closable lid 31 is opened and the cradle 33 is moved upward.

Subsequently, when the washed object such as a wafer W is placed on the cradle 33, the carrying unit, not shown, is retracted from the drying tank 30, the openable and closable lid 31 is closed, and the cradle 33 is lowered into the rinsing tank 40 together with the wafer W.

(3) Drying Step Shown in FIG. 9(c)

FIG. 9(c) shows a rinsing step using deionized water performed in the rinsing tank 40. The valve 51 on the channel (4) shown in FIG. 2 is opened, and deionized water is supplied from the deionized water supplying nozzle 41 for overflow rinsing. The openable and closable lid 31 is closed, the cradle 33 is in the lowered state, and the states of supply of nitrogen gas ($N_2$), suction exhaust, IPA circulation are identical to the case shown in FIG. 9(b). The overflow rinsing is performed at a rate of about 30 litters/min for about 60 seconds.

(4) Drying Step Shown in FIG. 9(d)

FIG. 9(d) shows a state in which the cradle 33 on which the wafer W is placed in the rinsing tank 40 is moved upward after overflow rinsing in the step 3 in FIG. 10 is finished. As is clear from FIG. 10, the process in the step 4 is identical to that in the step 3 except for upward movement of the cradle 33. The period of time required for moving the cradle 33 upward is approximately 30 seconds as shown in the step 4 in FIG. 10. The upward movement of the cradle 33 will be stopped in a state in which the lower surface of the wafer W is slightly immersed in the fluid surface in the rinsing tank 40, as is clear from FIG. 9(e). Though the stop position of the cradle 33 is controlled by a control unit which is not shown in the figure, the stop position is set in advance. When the washed object is a wafer W, since the wafer W is provided with a pattern on the surface thereof, it is stopped in a state in which the portion of the wafer W in the vicinity of the outer periphery thereof, which is not formed with a pattern, comes into contact with the fluid surface. In this case, the wafer W as a washed object is still wet when it is drawn upward from the rinsing tank 40 by the hoisting mechanism.

Figure 15:
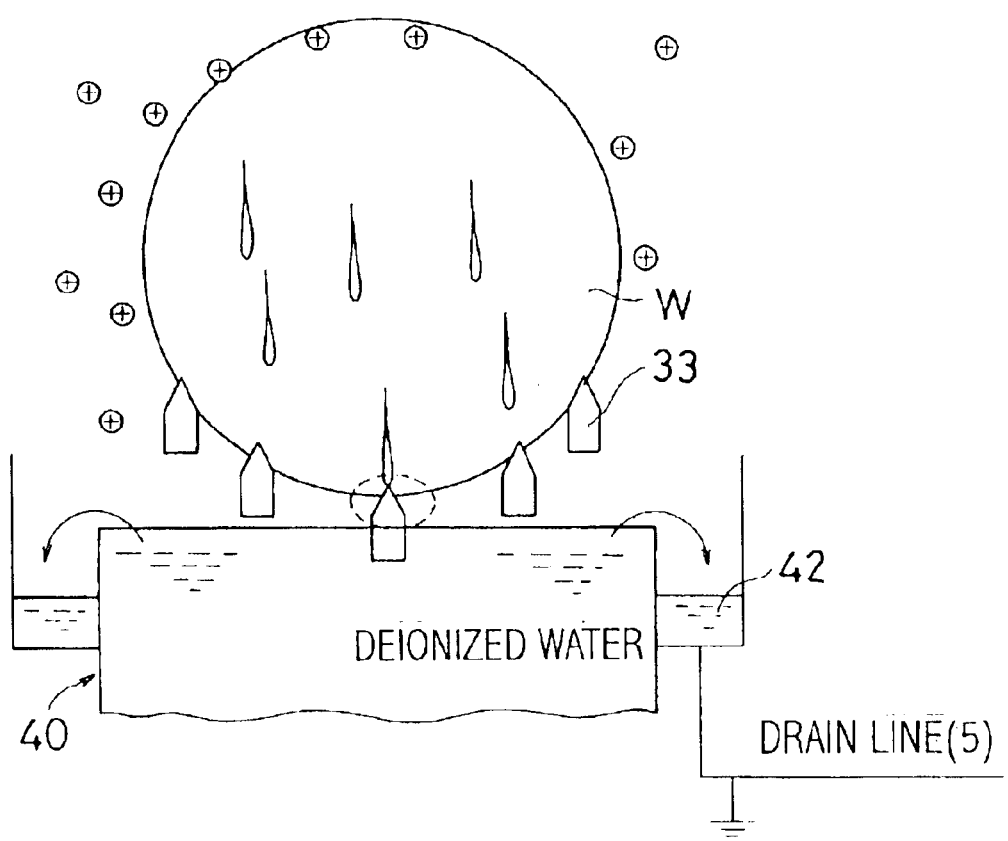
FIG. 15 is a diagrammatic sketch of a state in which electrostatic charge is being removed.

Though a state in which the lower surface of the wafer W is directly in contact with and immersed into the fluid surface in the rinsing tank 40 has been described, the inventor verified that electrostatic charge can be removed by bringing the wafer W into indirect contact with the fluid surface in the rinsing tank 40 by the use of a draining rod for securing indirect contact between the wafer W and rinsing water as shown in FIG. 15, and allowing water to drop via the draining rod. FIG. 15 is a diagrammatic sketch of a state in which electrostatic charge is being removed.

(5) Drying Step Shown in FIG. 9(e)

FIG. 9(e) corresponds to the step 5 in FIG. 10, in which the valve 62 shown in FIG. 2 is closed and the valve 63 is opened, and the valve 57 is opened to supply two types of fluid, IPA as an organic solvent and nitrogen gas ($N_2$), from the fluid spray nozzle into the drying tank 30. Such IPA mist supply continues for approximately 120 seconds as shown in FIG. 10. In this case, the IPA heater 67 can be heated to the temperature in the range between 5° C. and 80° C., and the IPA heater 67 is turned ON when supplying IPA mist.

As shown in FIG. 11, the IPA mist atmosphere in the drying tank 30 is apt to become positively charged, and thus the wafer W is apt to be charged as well. Accordingly, in the drying method of the invention, as shown in FIG. 11, residual water on the wafer W with IPA mist dissolved therein runs along the surface on the wafer W downwardly and drops into deionized water in the rinsing tank 40 and dissolves therein. Since overflow rinsing is performed as is clear from the step 5 in FIG. 10, the overflow tank 42 is grounded via a drainage channel (FIG. 2 (5)) and thus positive electrostatic charge is removed.

FIG. 12(a) is a graph illustrating measured amount of electrostatic charge on the wafer surface when it is dried without immersing the lower surface of the wafer W in the fluid surface in the rinsing tank 40 according to a method other than the invention. Such measurement is performed during the drying process shown in FIG. 9(e) and in the step 5 in FIG. 10. Change in the amount of electrostatic charge shown in FIG. 12(a) is caused by the phenomenon in which electrostatic charge is temporarily removed from the wafer W when residual water on the surface of the wafer W and IPA drop into rinsing water in the rinsing tank 40.

FIG. 12(b) is a graph illustrating measured amount of electrostatic charge on the surface of the wafer when the wafer W is dried with the lower surface of the wafer W directly immersed into the fluid surface in the rinsing tank 40 according to the invention. Such measurement is performed during the drying process shown in FIG. 9(e) and in the step 5 in FIG. 10, and it is recognized that the amount of electrostatic charge on the surface of the wafer is removed according to the invention. The same effects can be obtained when removal of electrostatic charge is performed without immersing the lower surface of the wafer W directly into the fluid surface in the rinsing tank 40, but performed indirectly by the use of drainage rod as is described in conjunction with FIG. 15.

(6) Drying Step Shown in FIG. 9(f)

FIG. 9(f) shows a state in which the valve 63 shown in FIG. 2 is closed, and the valve 62 in the same figure is opened to stop supply of IPA mist and thus IPA is circulated. Subsequently, the drain valve 43 is opened to drain deionized water in the rinsing tank 40. The period of time required for processing is approximately 10 seconds. As shown in the step 6 in FIG. 10, nitrogen gas ($N_2$) is supplied through the nitrogen gas ($N_2$) supply channel (1), the valve 56, the filter 55, and the nitrogen gas supply port 37 into the drying tank 30, and in the exhaust channel (3), the valve 64 is opened and thus sunction exhaust is being performed.

(7) Drying Step Shown in FIG. 9(g)

FIG. 9(g) corresponds to the step 7 in FIG. 10, and illustrates a state in which the valve 56 is closed to stop supply of nitrogen gas ($N_2$) at ordinary temperatures, the valve 53 is opened, and nitrogen gas ($N_2$) is heated by the heater 54 to supply nitrogen gas ($N_2$) at high temperatures into the drying tank 30. The period of time required for supplying nitrogen gas ($N_2$) at high temperatures is approximately 150 seconds, and during which the surface of the wafer W in the drying tank 30 is quickly dried.

(8) Drying Step Shown in FIG. 9(h)

FIG. 9(h) shows a state in which the valve 53 is closed and the heater 54 is turned off under the atmosphere of high-temperature nitrogen gas ($N_2$) in the previous step, and then the valve 56 is opened to supply nitrogen gas ($N_2$), which is inert gas at ordinary temperatures, into the drying tank 30 to return the interior of the drying tank 30 to ordinary temperatures, which is so called "cooling down". The period of time required for this process is approximately 30 seconds. The interior of the drying tank 30 is maintained in an inert gas atmosphere by nitrogen gas ($N_2$), which is an inert gas at ordinary temperatures, being supplied from the nitrogen gas supply port 37, so that the surface of the wafer, for example, a silicone (Si) can be prevented from reoxidization.

(9) Drying Step Shown in FIG. 9(i)

FIG. 9(i) shows a state in which the openable and closable lid 31 is opened to carry the dried wafer W placed on the cradle 33 out of the drying tank 30 with the carrying unit, not shown, as shown in the step 9 in FIG. 10.

As is described above, the drying apparatus according to the invention is constructed of the drying tank 30 and the rinsing tank 40, and thus the space can be saved. Further, since organic solvent mist is not supplied in the step of drawing the wafer W up from the rinsing tank 40 according to the invention, Marangoni Effects do not occur at the interface between the wafer W and rinsing water in the rinsing tank 40. Therefore, particle transfer does not occur neither. In the drying method according to the invention, gas at ordinary temperatures is used as nitrogen gas ($N_2$), which is an inert gas in order to maintain the atmosphere at ordinary temperatures. Therefore, nitrogen gas ($N_2$) as an inert gas used in the step of vaporizing organic solvent (IPA) for drying (the step 7 in FIG. 10) is preheated, because it enables quick drying. Temperatures to be heated are preferably between 20° C. and 100° C. according to the exemplified experiment. However, gas at ordinary temperatures, which is not heated, may be used depending on the type of washed objects. Though nitrogen gas ($N_2$) is used as an inert gas in this embodiment, argon gas may be used as an alternative. Further more, according to the invention, adherence of particles from the wafer having an oxidized film or a pattern may be prevented, and reoxidization of the surface of the silicon (Si) can be prevented.

Figure 16:
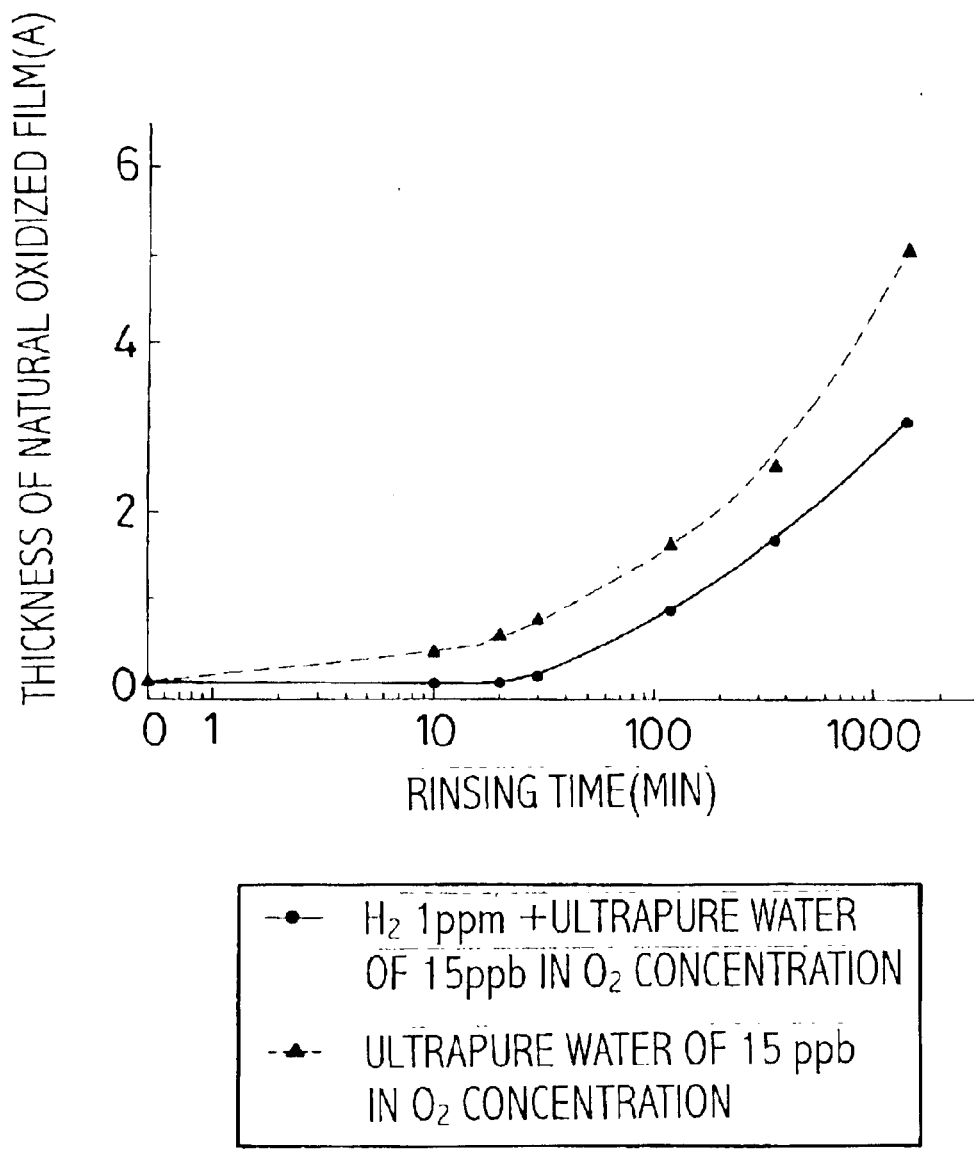
FIG. 16 is a graph of the thickness of oxidized film on the surface of the silicon measured after being etched by DHF (HF/$H_2O$) (diluted hydrofluoric acid) and being rinsed with hydrogenated water which is obtained by adding hydrogen water to rinsing water in the rinsing tank by the use of the drying apparatus according to the invention, and then performed the drying process.

FIG. 16 is a graph of the thickness of oxidized film on the surface of the silicon measured after being etched by DHF ($HF/H_2O$) (diluted hydrofluoric acid) and being rinsed with hydrogenated water which is obtained by adding hydrogen water to rinsing water in the rinsing tank by the use of the drying apparatus according to the invention and then performed the drying process. The lateral axis represents rinsing time (min), and the vertical axis represents the thickness of natural oxidized film (angstrom).

As shown in FIG. 16, though the thickness of oxidized film formed on the surface of the silicon increases in accordance with the rinsing time, the inventor verified that development of natural oxidized film is suppressed when rinsed with hydrogenated water in comparison with the case of being rinsed with ultra pure water having an $O_2$ concentration of 15 ppb. It is considered to be because bonding between silicon (Si) and hydrogen is promoted due to existence of hydrogen in rinsing water and thus bonding between silicon (Si) and oxygen is hindered. From these reasons, using hydrogenated water which is obtained by adding hydrogen water to rinsing water suppresses development of natural oxidized film on the surface of the silicon and prevents formation of watermark. Therefore, with the drying apparatus and the drying method according to the invention, hydrogenated water may be selected as rinsing water.

Figure 17:
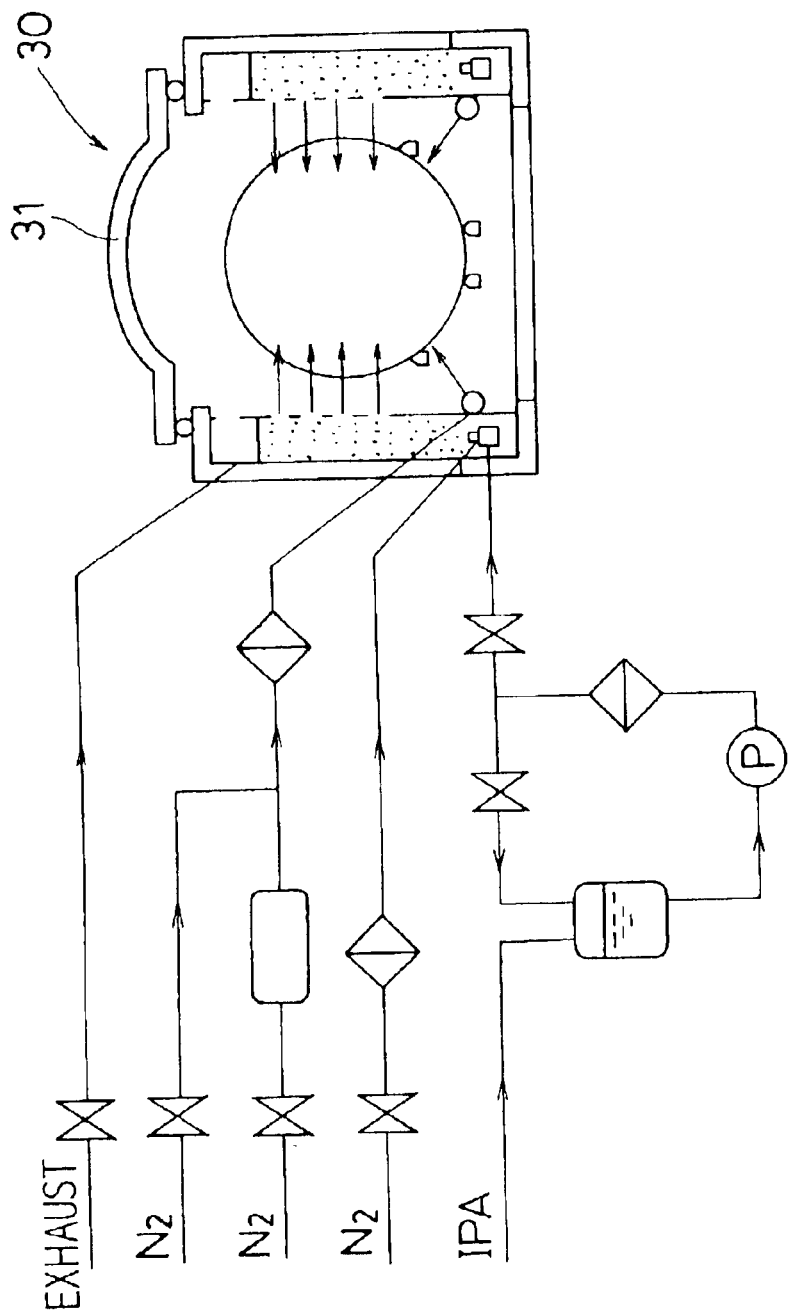
FIG. 17 is a drawing showing another embodiment of the drying apparatus.

Referring now to FIG. 17, another embodiment of the drying apparatus according to the invention will be described. Since basic constructions and functions are substantially identical to the apparatus shown in FIG. 2, only the different points will be described.

As shown in FIG. 17, since the drying apparatus 30 has a construction that does not have the rinsing tank 40, it does not have the overflow tank 42. Therefore, the drying apparatus shown in FIG. 17 is intended to perform only drying operation for the wafer W as a washed object which has rinsed already in the previous step.

According to the invention, particle transfer due to Marangoni Force does not occur, and oxygen is purged because an inert gas atmosphere is formed by nitrogen, whereby formation of watermark is prevented and improvement of productivity is realized. Further, since the process is performed in a sealed structure, contamination of the washed object can be prevented.

As is described thus far, according to the present invention, since organic solvent mist is indirectly emitted, the diameter of organic solvent mist can be reduced. Further, according to the invention, particle transfer due to Marangoni Force does not occur, and oxygen is purged because an inert gas atmosphere is formed by nitrogen, whereby formation of watermark can be prevented and improvement of productivity is realized. Furthermore, since the process is performed in a sealed structure, contamination of the washed object can be prevented.

What is claimed is:

1. An apparatus for drying a washed object, comprising:
   a drying tank;
   a mist-straightening vane provided in the drying tank, said mist-straightening vane comprising a side surface which faces the washed object, and said side surface including a solid lower section and an upper section having a plurality of fine openings; and
   a fluid spray nozzle provided in a lower portion of the mist-straightening vane for supplying an organic mist;
   wherein a portion of the organic mist supplied by the fluid spray nozzle is emitted through the plurality of fine openings in the upper section of said side surface of the mist-straightening vane toward the washed object.

2. The apparatus according to claim 1, wherein the mist-straightening vane is provided on a side wall of the drying tank.

3. The apparatus according to claim 1, wherein the fluid spray nozzle is adapted to emit at least two different types of fluid simultaneously.

4. The apparatus according to claim 1, wherein the fluid spray nozzle is adapted to emit organic solvent mist and inert gas.

5. The apparatus according to claim 3, wherein the at least two different types of fluid comprise organic solvent mist and inert gas.

6. The apparatus according to claim 1, wherein the plurality of fine openings comprise chamfered inner side surfaces.

7. The apparatus according to claim 1, wherein the solid lower portion of the side surface of the mist-straightening vane has a height of 100 mm.

8. An apparatus for drying a washed object, comprising:
   a drying tank having an opening in an upper portion thereof for inserting and removing the washed object;
   a rinsing tank formed integrally with the drying tank;
   a lid which is adapted to be hermetically sealed when closed;
   an overflow tank formed integrally with the drying tank and the rinsing tank and provided externally to the rinsing tank; and
   a mist-straightening vane provided in the drying tank, said mist-straightening vane comprising a side surface which faces the washed object, and said side surface including a solid lower section and an upper section having a plurality of fine openings;
   wherein the overflow tank is adapted to hold deionized water which overflows out of the rinsing tank.

9. The apparatus according to claim 8, further comprising a channel for draining the overflow tank, wherein the channel is grounded.

10. The apparatus according to claim 8, further comprising cradles for placing and holding the washed object, wherein the cradles are movable between the drying tank and the washing tank by a hoisting mechanism, and the cradles are adapted to be stopped when a portion of the washed object is in contact with the fluid level.

11. The apparatus according to claim 10, wherein the cradles are adapted to prevent a patterned surface of the washed object from coming in contact with the fluid level.

* * * * *